United States Patent
Takamizawa et al.

[11] Patent Number: 5,970,365
[45] Date of Patent: Oct. 19, 1999

[54] SILICON WAFER INCLUDING AMORPHOUS SILICON LAYER FORMED BY PCVD AND METHOD OF MANUFACTURING WAFER

[75] Inventors: Shoichi Takamizawa, Nishishirakawa; Norihiro Kobayashi, Annaka, both of Japan

[73] Assignee: Shin-Etsu Handotai., Ltd., Tokyo, Japan

[21] Appl. No.: 08/826,441

[22] Filed: Mar. 24, 1997

[30] Foreign Application Priority Data

Mar. 28, 1996 [JP] Japan ..................... 8-099370

[51] Int. Cl.⁶ ............... H01L 21/30; H01L 21/46
[52] U.S. Cl. ............................. 438/459; 438/977
[58] Field of Search ..................... 438/459, 977, 438/471

[56] References Cited

U.S. PATENT DOCUMENTS

| | | |
|---|---|---|
| 4,561,171 | 12/1985 | Schlosser . |
| 4,645,546 | 2/1987 | Matsushita et al. . |
| 4,692,345 | 9/1987 | Nishiura et al. ............ 427/39 |
| 5,327,007 | 7/1994 | Imura et al. .............. 257/610 |
| 5,374,842 | 12/1994 | Kusakabe . |
| 5,449,532 | 9/1995 | Toyokawa ................ 427/255 |
| 5,757,063 | 5/1998 | Tomita et al. ............ 257/610 |

FOREIGN PATENT DOCUMENTS

| | | |
|---|---|---|
| 0588055 | 3/1994 | European Pat. Off. . |
| A-4-2133 | 1/1992 | Japan . |
| 4-42540 | 2/1992 | Japan . |
| 7-221112 | 8/1995 | Japan . |

Primary Examiner—Brian Dutton
Attorney, Agent, or Firm—Oliff & Berridge, PLC

[57] ABSTRACT

A silicon wafer has an amorphous silicon layer formed on one main surface thereof. The amorphous silicon layer is formed by plasma chemical vapor deposition. The silicon wafer has a gettering layer that possesses high gettering capability and enhanced continuance of the gettering capability. Moreover, the stress acting on the silicon wafer due to the gettering layer is reduced so that the warpage of the silicon wafer decreases. The silicon wafer can be manufactured with high productivity.

5 Claims, 5 Drawing Sheets

SILICON WAFER INCLUDING AMORPHOUS SILICON LAYER FORMED BY PCVD AND METHOD OF MANUFACTURING WAFER

BACKGROUND OF THE INVENTION

1. Field of the Invention

The present invention relates to a silicon wafer and its manufacturing method. More particularly, the present invention relates to a silicon wafer having an amorphous silicon layer, formed as a gettering layer, on the main surface (hereinafter referred to as a "reverse surface") opposite to the main surface (hereinafter referred to as a "front surface") on which semiconductor devices will be fabricated, as well as to a method of manufacturing the silicon wafer.

2. Description of the Related Art

For various reasons, impurities such as heavy metals are generated during fabrication of a semiconductor device from a silicon wafer, and the thus-generated impurities contaminate the vicinity of the surface of a silicon wafer which will become an active area in the semiconductor device. If the vicinity of the surface of the silicon wafer which will become an active area is contaminated by impurities, the characteristics of the device are degraded, which in turn reduces the proportion of non-defective devices. To prevent such a problem, a technique of intentionally collecting impurities outside of the active area; namely, a gettering technique, is commonly used. A representative method of the gettering technique is the forming of a polycrystalline silicon layer as a gettering layer on the reverse surface of a silicon wafer.

According to this conventional method, a polycrystalline silicon layer is usually formed by growing polycrystalline silicon on the reverse surface of the silicon using a LPCVD (Low Pressure Chemical Vapor Deposition) method.

The silicon wafer having a polycrystalline layer formed on the reverse surface thereof undergoes stress. Compared with a silicon wafer without a polycrystalline silicon layer, the silicon wafer having a polycrystalline layer becomes warped to a greater extent. If polycrystalline silicon is grown on the reverse surfaces of silicon wafers of different diameters under the same conditions, the warpage increases with the diameter of the silicon wafer. Associated with a recent tendency of a semiconductor device to be highly integrated with higher accuracy, the diameter of the silicon wafer is steadily increasing. Because of this, it is to be desired that the warpage of the silicon wafer be reduced to as small an extent as possible.

In order to reduce the warpage of the silicon wafer, a polycrystalline silicon layer is formed on a silicon wafer under conditions such that the stress acting on the silicon wafer decreases. For example, the polycrystalline silicon layer is formed on the silicon wafer at a high temperature such that the grain size of polycrystalline silicon becomes greater, or the polycrystalline silicon layer is formed so as to become thinner. In these cases, however, the gettering capability of the polycrystalline silicon layer is decreased, as shown in FIG. 1.

As a polycrystalline silicon layer is subjected to heat treatment during fabrication of semiconductor devices from a silicon wafer, the polycrystalline silicon layer is further crystallized into monocrystal, thereby resulting in a reduction in the gettering capability of the polycrystalline silicon layer.

There has been proposed a silicon wafer whose gettering capability is enhanced by formation of an amorphous layer instead of the polycrystalline silicon layer (see Japanese Patent Application Laid-Open (kokai) No. 4-2133). As shown in FIG. 5, in addition to the advantage of improved gettering capability, the amorphous silicon layer has the advantage of being resistant to crystallization into monocrystal relative to the polycrystalline silicon layer, even when it is subjected to heat treatment during the fabrication of semiconductor devices, thus providing the advantage of longer continuance of the gettering capability.

As illustrated in FIG. 2, if an amorphous silicon layer is formed (designated by (b) in FIG. 2) by growing amorphous silicon on the reverse surface of the silicon wafer using the low pressure chemical vapor deposition method in the same way as for polycrystalline silicon, the stress acting on the silicon wafer becomes larger than the stress resulting from formation of a polycrystalline silicon layer (designated by (a) in FIG. 2). As a result, the warpage of the silicon wafer becomes still greater. As illustrated in FIG. 1, as is the case of formation of a polycrystalline silicon layer, even if an amorphous silicon layer is formed using the low pressure chemical vapor deposition method, the stress acting on the silicon wafer increases so long as the gettering capability of the amorphous silicon layer increases.

To grow amorphous silicon on the reverse surface of the silicon wafer, it is necessary to reduce growth temperature. As a result of this, as illustrated in FIG. 3, a growth rate of the amorphous silicon (designated by (b) in FIG. 3) becomes extremely low as compared with that of the polycrystalline silicon (designated by (a) in FIG. 3), thereby resulting in a decrease in the productivity of a silicon wafer.

SUMMARY OF THE INVENTION

Through various studies which have been made by the inventors of the present invention in light of the aforementioned drawbacks in the art, the inventors have discovered the following phenomena:

Provided that an amorphous silicon layer is formed by growing amorphous silicon on the reverse surface of a silicon wafer using a plasma chemical vapor deposition method in lieu of the low pressure chemical vapor deposition method, 1) as illustrated in FIG. 3, the rate (designated by (c) in FIG. 3) at which amorphous silicon is grown using the plasma chemical vapor deposition method becomes higher than the rate (designated by (b) in FIG. 3) at which amorphous silicon is grown using the low pressure chemical vapor deposition method, as well as larger than a growth rate (designated by (a) in FIG. 3) of polycrystalline silicon which is larger than the growth rate of the amorphous silicon formed by the low pressure chemical vapor deposition method;

2) as illustrated in FIG. 2, the stress (designated by (c) in FIG. 2) acting on a silicon wafer having an amorphous silicon layer formed by the plasma chemical vapor deposition method becomes lower than the stress (designated by (b) in FIG. 2) acting on a silicon wafer having an amorphous silicon layer formed by the low pressure chemical vapor deposition method, as well as lower than the stress (designated by (a) in FIG. 2) acting on a silicon wafer having a polycrystalline silicon layer;

3) as illustrated in FIG. 4, the gettering capability (designated by (c) in FIG. 4) of an amorphous silicon layer formed by the plasma chemical vapor deposition method is substantially the same as that of the amorphous silicon layer (designated by (b) in FIG. 4) formed by the low pressure chemical vapor deposition method; and 4) as illustrated in FIG. 5, when the amorphous silicon layer is subjected to heat treatment, the continuance of gettering capability of the amorphous silicon layer formed by the plasma chemical vapor deposition method is as high as that of the amorphous silicon layer formed by the low pressure chemical vapor deposition method.

If the amorphous silicon layer is formed using the plasma chemical vapor deposition method, the stress acting on the silicon wafer can be reduced, and the gettering capability of the amorphous silicon layer can be improved, as well. These effects are amazing and are completely in contrast to the tendency in the case where a polycrystalline silicon layer or an amorphous silicon layer is formed using the low pressure chemical vapor deposition method; i.e., the tendency of the gettering capability of the polycrystalline silicon layer to decrease with a decrease in the stress acting on the silicon wafer, as illustrated in FIG. 1. It is considered that a large amount of hydrogen atoms contained in the amorphous silicon formed by the use of the plasma chemical vapor deposition method contribute to improved continuance of the gettering capability.

Accordingly, an object of the present invention is to provide a silicon wafer which has a gettering layer possessing high gettering capability and enhanced continuance of the gettering capability and which undergoes reduced stress due to the gettering layer so that its warpage decreases.

Another object of the present invention is to provide a method of manufacturing such an improved silicon wafer with high productivity.

To achieve the above objects, the present invention provides a silicon wafer having an amorphous silicon layer formed on one main surface thereof. The amorphous silicon layer is formed by plasma chemical vapor deposition.

The present invention also provides the following manufacturing methods:

(1) A method of manufacturing a silicon wafer which has an amorphous silicon layer formed on one main surface thereof, characterized in that the amorphous silicon layer is formed on the main surface by plasma chemical vapor deposition;

(2) A method of manufacturing a silicon wafer which has an amorphous silicon layer formed on a first main surface thereof opposite to a mirror-finished second main surface thereof, characterized in that the amorphous silicon layer is formed on the first main surface by plasma chemical vapor deposition, and the second main surface is then mirror polished; and (3) A method of manufacturing a silicon wafer which has an amorphous silicon layer formed on a first main surface thereof opposite to a mirror-finished second main surface thereof, characterized in that the second main surface is mirror-polished, and the amorphous silicon layer is then formed on only the first main surface by plasma chemical vapor deposition.

Preferably, the main surface of the silicon wafer on which the amorphous silicon layer is to be formed is an etched or mirror-polished surface.

In the present invention, it is possible to provide a silicon wafer which has a gettering layer possessing high gettering capability and enhanced continuance of the gettering capability and which undergoes reduced stress due to the gettering layer so that its warpage decreases.

DESCRIPTION OF PREFERRED EMBODIMENTS

Embodiments of the present invention will now be described.

Figure 1:
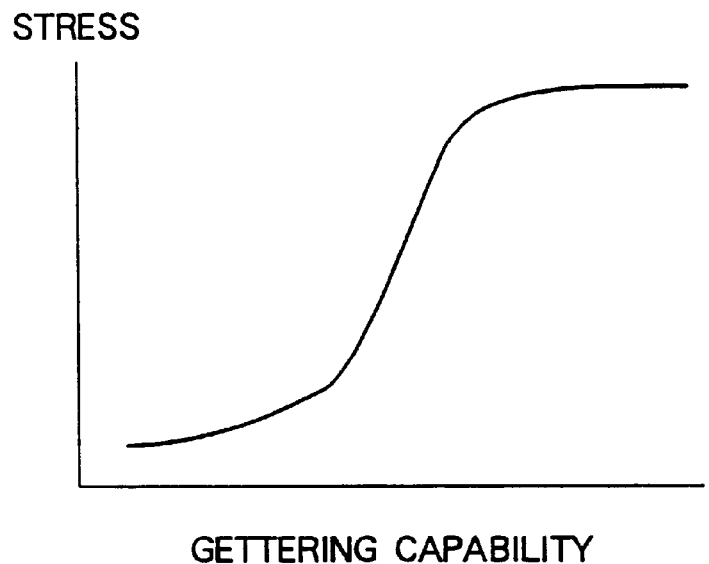
FIG. 1 is a graph illustrating the relationship between stress and gettering capability.
Figure 2:
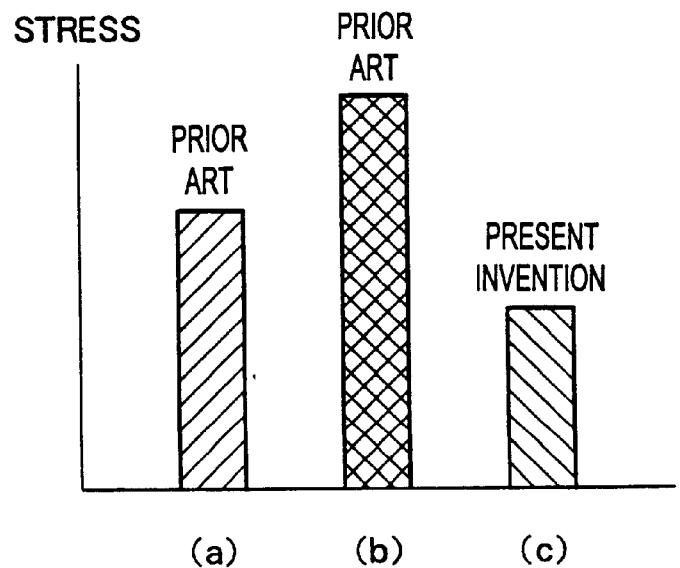
FIG. 2 is a graph illustrating stress acting on a silicon wafer having a gettering layer, wherein section (a) indicates the case where the gettering layer is a polycrystalline silicon layer formed using a prior art low pressure chemical vapor deposition method, section (b) indicates the case where the gettering layer is an amorphous silicon layer formed using the prior art low pressure chemical vapor deposition method, and section (c) indicates the case where the gettering layer is an amorphous silicon layer formed using a plasma chemical vapor deposition method according to the present invention.
Figure 3:
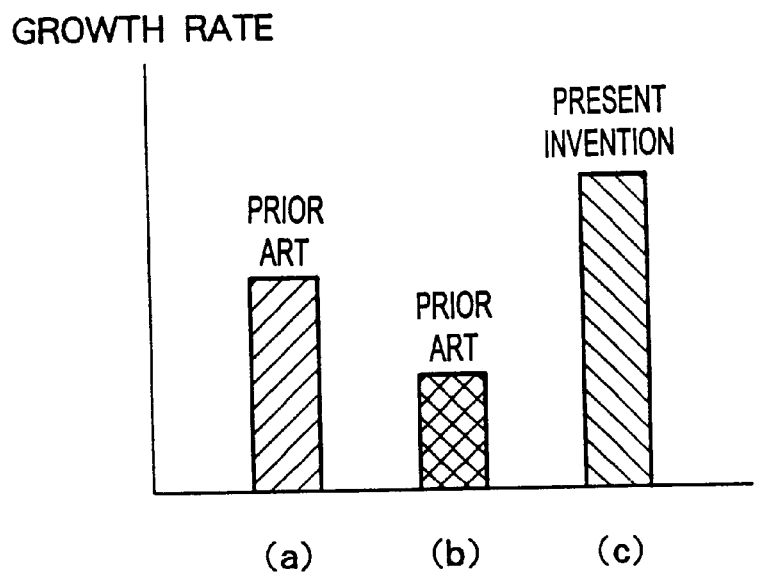
FIG. 3 is a graph illustrating the growth rate of polycrystalline or amorphous silicon, wherein section (a) indicates the case where polycrystalline silicon is grown using the prior art low pressure chemical vapor deposition method, section (b) indicates the case where amorphous silicon is grown using the prior art low pressure chemical vapor deposition method, and section (c) indicates the case where amorphous silicon is grown using the plasma chemical vapor deposition method according to the present invention.
Figure 4:
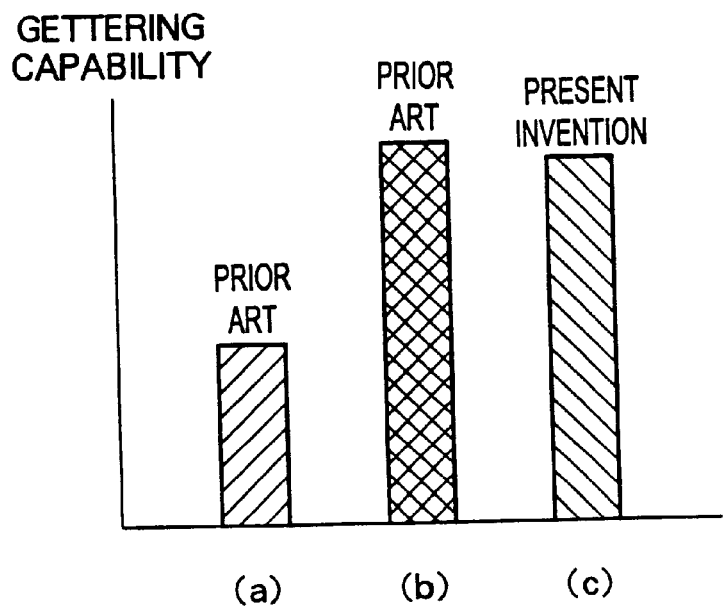
FIG. 4 is a graph illustrating the gettering capability of the gettering layer, wherein section (a) indicates the case where the gettering layer is a polycrystalline silicon layer formed using the prior art low pressure chemical vapor deposition method, section (b) indicates the case where the gettering layer is an amorphous silicon layer formed using the prior art low pressure chemical vapor deposition method, and section (c) indicates the case where the gettering layer is an amorphous silicon layer formed using the plasma chemical vapor deposition method according to the present invention.
Figure 5:
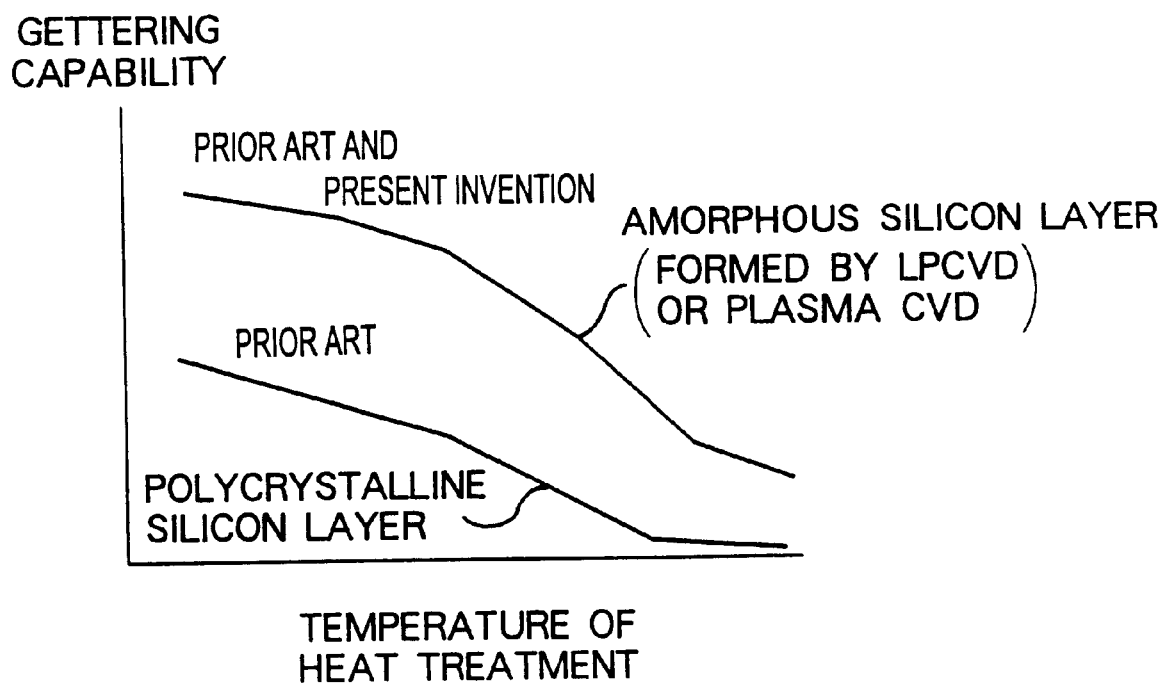
FIG. 5 is a graph illustrating the relationship between gettering capability and the temperature of heat treatment for the prior art (top and bottom curves) and the present invention (top curve)
Figure 6:
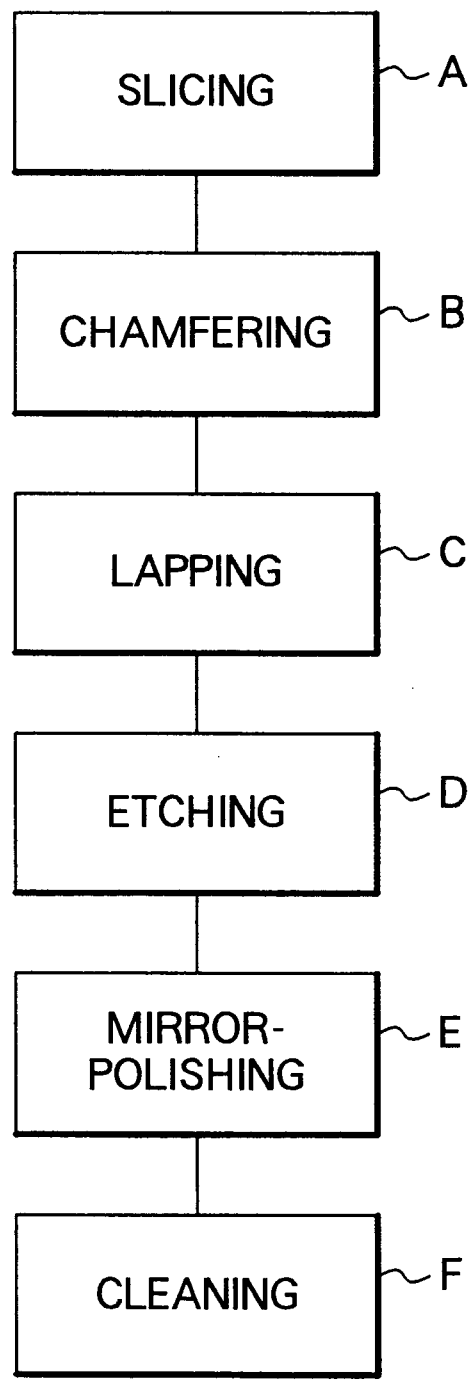
FIG. 6 is a flowchart illustrating exemplary steps (processes) of a method of manufacturing a silicon wafer without an amorphous silicon layer.

As illustrated in FIG. 6, a method of manufacturing a silicon wafer usually comprises a slicing process A for slicing a silicon monocrystalline rod manufactured by a monocrystal manufacturing apparatus into disk-shaped silicon wafers; a chamfering process B for chamfering the outer edge of each of the silicon wafers thus sliced in the slicing process A in order to prevent the silicon wafer from becoming cracked or chipped; a lapping process C for lapping the thus-chamfered silicon wafer so as to form a flat surface thereon; an etching process D for eliminating mechanical damage remaining in both the front and reverse surfaces of the chamfered and lapped silicon wafer; a mirror-polishing process E for polishing the surface of the etched silicon wafer; and a cleaning process F for cleaning the mirror-polished surface of the silicon wafer so as to remove polishing material and foreign matter adhered thereto.

Figure 7A:
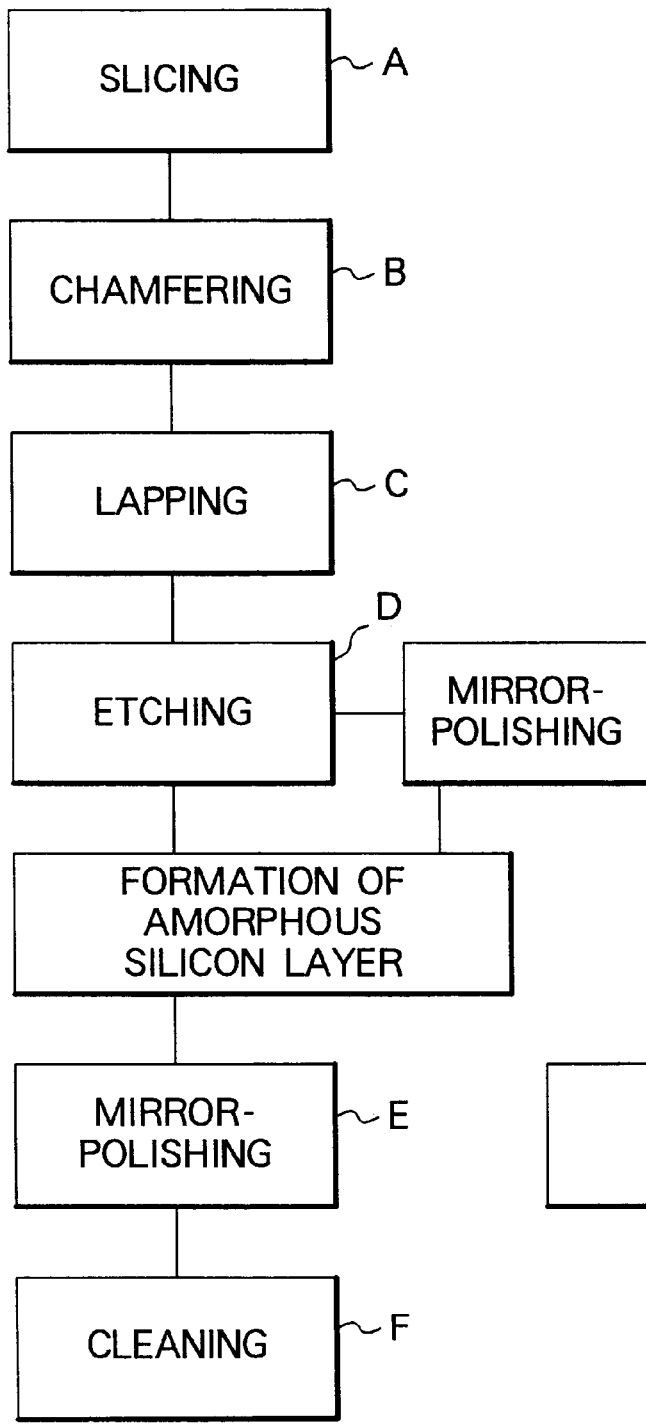
FIGS. 7A and 7B are flowcharts illustrating exemplary steps (processes) of the methods of manufacturing a silicon wafer according to the present invention.

As illustrated in FIG. 7A, a silicon wafer having an amorphous silicon layer formed on the reverse surface thereof according to the present invention is usually manufactured by forming an amorphous silicon layer on the reverse surface of the silicon wafer through use of the plasma chemical vapor deposition method after having etched it in the etching process D, and by subsequently subjecting the thus-formed amorphous silicon layer to the mirror-polishing process E and the cleaning process F. Further, it is also possible to manufacture such a silicon wafer by forming an amorphous silicon layer on the reverse surface of the silicon wafer using the plasma chemical vapor deposition method after the reverse surface of the silicon wafer has been mirror-polished, and by subsequently subjecting the amorphous silicon layer to the processing of the mirror-polishing process E and the cleaning process F.

While an amorphous silicon layer is formed on the reverse surface of the silicon wafer using the plasma chemical vapor deposition method, an amorphous silicon layer continued to the amorphous silicon layer on the reverse surface is unintentionally formed on the front surface. Even in this case, the thus-formed amorphous silicon layer on the front surface is eliminated by the mirror-polishing process E. In order to eliminate the silicon layer on the front surface of the silicon wafer through polishing, it is desirable that the polishing be performed is as little as possible in order to maintain the flatness of the surface. For this reason, it is preferred that the amorphous silicon layer formed on the front surface is soft (i.e., a quick polishing is desirable). Since the amorphous silicon layer formed using the plasma chemical vapor deposition method is soft and it can be polished quickly, the silicon wafer formed according to the present invention is very superior even in this respect.

Figure 7B:
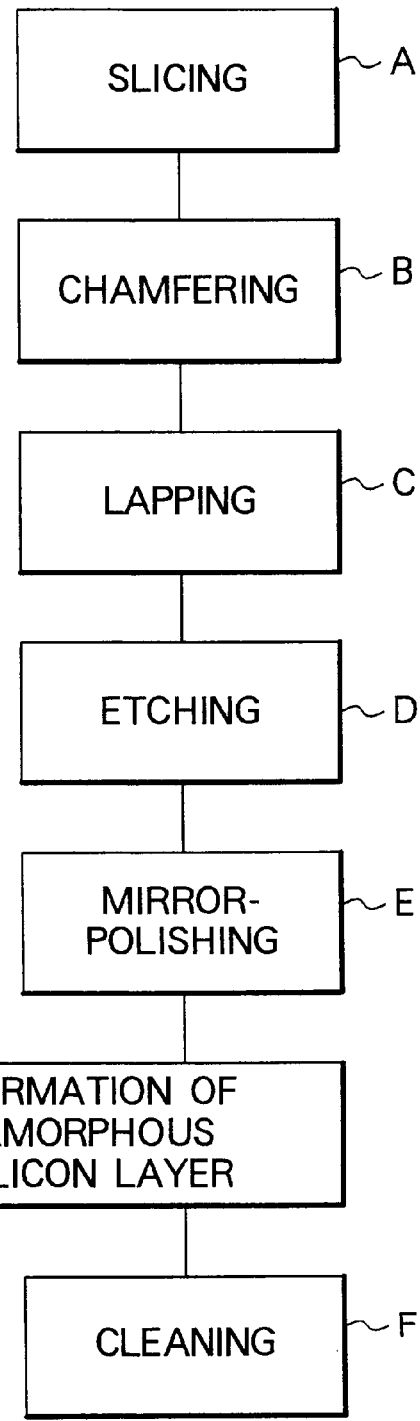

Alternatively, it is also possible to form an amorphous silicon layer on the reverse surface of the silicon wafer using the plasma chemical vapor deposition method after the front surface of, or the front and reverse surfaces of, the etched silicon wafer have been mirror-polished. In this case, since the amorphous silicon layer is formed solely on the reverse surface of the silicon wafer so that no amorphous silicon layer is formed on the front surface thereof, the silicon wafer can proceed to the cleaning process F without need for second mirror-polishing (re-mirror-polishing) of the front surface of the silicon wafer, as illustrated in FIG. 7B.

The amorphous silicon layer is usually formed on the reverse surface of the silicon wafer, using a plasma chemical vapor deposition apparatus which utilizes the plasma chemical vapor deposition method.

If an oxide film is grown on the amorphous silicon layer of the present invention, the amorphous silicon layer can be utilized in preventing an epitaxial wafer from autodoping during epitaxial growth of an epitaxial layer using a high-doped substrate.

EXAMPLE

Amorphous silicon and polycrystalline silicon were compared with each other with regard to growth rate, stress acting on a silicon wafer, and gettering capability of a gettering layer.

First, four silicon wafers were sliced from a silicon monocrystal rod manufactured by a floating zone method (a p-type conductivity). The thus-sliced silicon wafers were subjected to chamfering, lapping, and etching processing. A silicon wafer sliced from a silicon monocrystal rod manufactured by a CZ method possesses an intrinsic gettering effect and, hence, is unsuitable for use in checking the gettering capability of a gettering layer. For this reason, there were used the silicon wafers which were formed from the silicon monocrystal rod manufactured by the floating zone method and which did not have any intrinsic gettering effect. A silicon monocrystal rod manufactured by a CZ method is suitable for an actual application.

Example of the Invention

An amorphous silicon layer serving as a gettering layer was formed on the reverse surface of a wafer under the growth conditions shown in table 1, using a plasma chemical vapor deposition apparatus using a radio-frequency of 13.56 MHz (made by Novellus Systems Inc.).

Comparative Example 1

A polycrystalline silicon layer serving as a gettering layer was formed on the reverse surface of a wafer under the growth conditions shown in table 1, using a low pressure chemical vapor deposition apparatus (made by Shinko Denki Corporation).

Comparative Example 2

An amorphous silicon layer serving as a gettering layer was formed on the reverse surface of a wafer under the growth conditions shown in table 1, using the low pressure chemical vapor deposition apparatus (made by Shinko Denki Corporation).

The remaining silicon wafer was directly used as a silicon wafer without a gettering layer in measurement of gettering capability.

TABLE 1

| | Growth temperature (° C.) | Deposition thickness ($\mu$m) | Pressure within chamber (Pa) | Reaction gas | Gas flow rate (CC/min.) |
|---|---|---|---|---|---|
| Example of the Invention | 400 | 1.5 | 2 | $SiH_4$ | 150 |
| Comparative Example 1 | 650 | 1.5 | 10 | $SiH_4$ | 150 |
| Comparative Example 2 | 400 | 1.5 | 2 | $SiH_4$ | 150 |

The wafers of the Example of the present invention, Comparative Example 1, and Comparative Example 2 were measured with regard to the stress acting on the wafer and the gettering capability of the gettering layer in the following manners:

1) STRESS

The warpage of each silicon wafer was measured before and after the formation of its gettering layer, and the magnitude of the stress acting on the silicon wafer was calculated from the difference between the measured warpages before and after the formation of the getting layer.

2) GETTERING CAPABILITY

An iron-containing solution was coated to the surface of each of the silicon wafers having the gettering layer and the silicon wafer without the gettering layer, and the thus-coated surface of each silicon wafer was intentionally contaminated. Thereafter, the silicon wafers were subjected to heat treatment at a temperature of 1000° C. for one hour, so that iron was diffused into the silicon wafers. Subsequently, the silicon wafers were further subjected to heat treatment at a temperature of 650° C. for ten hours. Then, the concentration of iron in each silicon wafer with exclusion of the gettering layer was measured by the DLTS (Deep Level Transient Spectroscopy) method and the ICP-MS (Inductively Coupled Plasma Mass Spectrometry) method.

Using the concentration of iron in the silicon wafer having no gettering layer as a standard or reference, a ratio of iron captured by the gettering layer was calculated from a measurement value of the concentration of iron. The thus-calculated ratio was used as the gettering capability.

Table 2 shows the results of the measurement of the amorphous silicon and the polycrystalline silicon with regard to the growth rate, the stress acting on the silicon wafer and the gettering capability of the gettering layer.

TABLE 2

|  | Growth rate (nm/min.) | Stress (Pa) | Gettering capability (%) |
|---|---|---|---|
| Example of the Invention | 100 | $2 \times 10^8$ | 99 |
| Comparative Example 1 | 20 | $5 \times 10^8$ | 93 |
| Comparative Example 2 | 3 | $7 \times 10^8$ | 99 |

As is evident from Table 2, it is possible to grow the amorphous silicon at an extremely high growth rate by the use of the plasma chemical vapor deposition method. The stress acting on the silicon wafer which has an amorphous silicon layer formed by the plasma chemical vapor deposition method is lower than the stress acting on the silicon wafer which has a polycrystalline silicon layer formed by the low pressure chemical vapor deposition method. Further, it is understood that the amorphous silicon layer formed by the plasma chemical vapor deposition method has the same high gettering capability as the amorphous silicon layer formed by the low pressure chemical vapor deposition method.

The present invention is not limited to the above-described embodiments. The above-described embodiments are mere examples, and those having the substantially same structure as that described in the appended claims and providing the similar action and effects are included in the scope of the present invention.

What is claimed is:

1. A method of manufacturing a silicon wafer which has an amorphous silicon layer formed on a first main surface thereof, the first main surface being an etched or mirror-polished surface, said method comprising the step of forming the amorphous silicon layer on the first main surface by plasma chemical vapor deposition.

2. A method of manufacturing a silicon wafer according to claim 1, further comprising the step of mirror-polishing a second main surface of the silicon wafer opposite to the first main surface.

3. A method of manufacturing a silicon wafer according to claim 2, wherein the second main surface of the silicon wafer is mirror polished after the amorphous silicon layer is formed on the first main surface of the wafer.

4. A method of manufacturing a silicon wafer which has an amorphous silicon layer formed on a first main surface of the silicon wafer opposite to a mirror-finished second main surface of the silicon wafer, the first main surface being an etched or mirror-polished surface, said method comprising the steps of:

mirror-polishing the second main surface, or the first main surface and the second main surface, of the silicon wafer; and forming the amorphous silicon layer on the first main surface of the silicon wafer by plasma chemical vapor deposition.

5. A method of manufacturing a silicon wafer according to claim 4, wherein the amorphous silicon layer is formed solely on the first main surface of the silicon wafer.

* * * * *